(12) United States Patent
Richter et al.

(10) Patent No.: US 8,258,062 B2
(45) Date of Patent: Sep. 4, 2012

(54) CAP LAYER REMOVAL IN A HIGH-K METAL GATE STACK BY USING AN ETCH PROCESS

(75) Inventors: Ralf Richter, Dresden (DE); Frank Seliger, Dresden (DE); Martin Mazur, Pulsnitz (DE)

(73) Assignee: Globalfoundries Inc., Grand Cayman (KY)

( * ) Notice: Subject to any disclaimer, the term of this patent is extended or adjusted under 35 U.S.C. 154(b) by 281 days.

(21) Appl. No.: 12/824,534

(22) Filed: Jun. 28, 2010

(65) Prior Publication Data

US 2010/0330808 A1 Dec. 30, 2010

(30) Foreign Application Priority Data

Jun. 30, 2009 (DE) .......................... 10 2009 031 146

(51) Int. Cl.
H01L 21/302 (2006.01)
H01L 21/461 (2006.01)
(52) U.S. Cl. ........................................ 438/689; 438/694
(58) Field of Classification Search .................. 438/691, 438/692, 694
See application file for complete search history.

(56) References Cited

U.S. PATENT DOCUMENTS

| | | | | |
|---|---|---|---|---|
| 6,171,910 | B1 * | 1/2001 | Hobbs et al. | 438/275 |
| 7,271,045 | B2 * | 9/2007 | Prince et al. | 438/199 |
| 2007/0287259 | A1 | 12/2007 | Kavalieros et al. | 438/301 |

FOREIGN PATENT DOCUMENTS

DE 102 28 807 A1 1/2004

OTHER PUBLICATIONS

Translation of Official Communication from German Patent Office for German Patent Application No. 10 2009 031 146.7 dated Sep. 14, 2010.

* cited by examiner

*Primary Examiner* — Roberts Culbert
(74) *Attorney, Agent, or Firm* — Williams, Morgan & Amerson, P.C.

(57) ABSTRACT

In a replacement gate approach, the dielectric cap layers of the gate electrode structures are removed in a separate removal process, such as a plasma assisted etch process, in order to provide superior process conditions during the subsequent planarization of the interlayer dielectric material for exposing the sacrificial gate material. Due to the superior process conditions, the selective removal of the sacrificial gate material may be accomplished with enhanced uniformity, thereby also contributing to superior stability of transistor characteristics.

25 Claims, 9 Drawing Sheets

CAP LAYER REMOVAL IN A HIGH-K METAL GATE STACK BY USING AN ETCH PROCESS

BACKGROUND OF THE INVENTION

1. Field of the Invention

Generally, the present disclosure relates to the fabrication of sophisticated integrated circuits including transistor elements comprising highly capacitive gate structures on the basis of a high-k gate dielectric material and a metal-containing electrode material.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout, wherein field effect transistors represent one important type of circuit element that substantially determines performance of the integrated circuits. Generally, a plurality of process technologies are currently practiced, wherein, for many types of complex circuitry, including field effect transistors, CMOS technology is currently one of the most promising approaches due to the superior characteristics in view of operating speed and/or power consumption and/or cost efficiency. During the fabrication of complex integrated circuits using, for instance, CMOS technology, millions of transistors, i.e., N-channel transistors and P-channel transistors, are formed on a substrate including a crystalline semiconductor layer. A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed adjacent to the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length, and associated therewith the reduction of channel resistivity, is a dominant design criterion for accomplishing an increase in the operating speed of the integrated circuits.

Presently, the vast majority of integrated circuits are based on silicon, due to substantially unlimited availability, the well-understood characteristics of silicon and related materials and processes and the experience gathered during the last 50 years. Therefore, silicon will likely remain the material of choice for future circuit generations designed for mass products. One reason for the importance of silicon in fabricating semiconductor devices has been the superior characteristics of a silicon/silicon dioxide interface that allows reliable electrical insulation of different regions from each other. The silicon/silicon dioxide interface is stable at high temperatures and, thus, allows performing subsequent high temperature processes, as are required, for example, for anneal cycles to activate dopants and to cure crystal damage without sacrificing the electrical characteristics of the interface.

For the reasons pointed out above, in field effect transistors, silicon dioxide is preferably used as a base material of a gate insulation layer that separates the gate electrode, frequently comprised of polysilicon or metal-containing materials, from the silicon channel region. In steadily improving device performance of field effect transistors, the length of the channel region has been continuously decreased to improve switching speed and drive current capability. Since the transistor performance is controlled by the voltage supplied to the gate electrode to invert the surface of the channel region to a sufficiently high charge density for providing the desired drive current for a given supply voltage, a certain degree of capacitive coupling, provided by the capacitor formed by the gate electrode, the channel region and the silicon dioxide disposed therebetween, has to be maintained. It turns out that decreasing the channel length requires an increased capacitive coupling to avoid the so-called short channel behavior during transistor operation. The short channel behavior may lead to an increased leakage current and to a pronounced dependence of the threshold voltage on the channel length. Aggressively scaled transistor devices with a relatively low supply voltage and thus reduced threshold voltage may suffer from an exponential increase of the leakage current while also requiring enhanced capacitive coupling of the gate electrode to the channel region. Thus, the thickness of the silicon dioxide layer has to be correspondingly decreased to provide the required capacitance between the gate and the channel region. For example, a channel length of approximately 0.08 μm may require a gate dielectric made of silicon dioxide as thin as approximately 1.2 nm. Although generally usage of high speed transistor elements having an extremely short channel may be substantially restricted to high speed signal paths, whereas transistor elements with a longer channel may be used for less critical signal paths, such as storage transistor elements, the relatively high leakage current caused by direct tunneling of charge carriers through an ultra-thin silicon dioxide gate insulation layer may reach values for an oxide thickness in the range or 1-2 nm that may not be compatible with thermal design power requirements for performance driven circuits.

Therefore, replacing silicon dioxide based dielectrics as the material for gate insulation layers has been considered, particularly for extremely thin silicon dioxide based gate layers. Possible alternative materials include materials that exhibit a significantly higher permittivity so that a physically greater thickness of a correspondingly formed gate insulation layer provides a capacitive coupling that would be obtained by an extremely thin silicon dioxide layer. It has thus been suggested to replace silicon dioxide with high permittivity materials such as tantalum oxide ($Ta_2O_5$), with a k of approximately 25, strontium titanium oxide ($SrTiO_3$), having a k of approximately 150, hafnium oxide ($HfO_2$), HfSiO, zirconium oxide ($ZrO_2$) and the like.

Additionally, transistor performance may be increased by providing an appropriate conductive material for the gate electrode to replace the usually used polysilicon material, since polysilicon may suffer from charge carrier depletion at the vicinity of the interface to the gate dielectric, thereby reducing the effective capacitance between the channel region and the gate electrode. Thus, a gate stack has been suggested in which a high-k dielectric material provides enhanced capacitance based on the same thickness as a silicon dioxide based layer, while additionally maintaining leakage currents at an acceptable level. On the other hand, the non-polysilicon material, such as titanium nitride and the like, in combination with other metals, may be formed so as to connect to the high-k dielectric material, thereby substantially avoiding the presence of a depletion zone. Since the threshold voltage of the transistors, which represents the voltage at which a conductive channel forms in the channel region, is significantly determined by the work function of the metal-containing gate material, an appropriate adjustment of the effective work function with respect to the conductivity type of the transistor under consideration has to be guaranteed.

Providing different metal species for adjusting the work function of the gate electrode structures for P-channel transistors and N-channel transistors at an early manufacturing stage may, however, be associated with a plurality of difficulties, which may stem from the fact that a complex patterning sequence may be required during the formation of the sophisticated high-k metal gate stack, which may result in a significant variability of the resulting work function and thus threshold of the completed transistor structures. For instance, during a corresponding manufacturing sequence, the high-k material may be exposed to oxygen, which may result in an increase of layer thickness and thus a reduction of the capacitive coupling. Moreover, a shift of the work function may be observed when forming appropriate work function metals in an early manufacturing stage, which is believed to be caused by a moderately high oxygen affinity of the metal species, in particular during high temperature processes which may typically be required for completing the transistor structures, for instance for forming drain and source regions and the like.

For this reason, in some approaches, the initial gate electrode stack may be provided with a high degree of compatibility with conventional polysilicon-based process strategies and the actual electrode metal and the final adjustment of the work function of the transistors may be accomplished in a very advanced manufacturing stage, i.e., after completing the basic transistor structure. In a corresponding replacement gate approach, the high-k dielectric material may be formed and may be covered by an appropriate metal-containing material, such as titanium nitride and the like, followed by a standard polysilicon or amorphous silicon material, which may then be patterned on the basis of well-established advanced lithography and etch techniques. Consequently, during the process sequence for patterning the gate electrode structure, the sensitive high-k dielectric material may be protected by the metal-containing material, possibly in combination with sophisticated sidewall spacer structures, thereby substantially avoiding any undue material modification during the further processing. After patterning the gate electrode structure, conventional and well-established process techniques for forming the drain and source regions having the desired complex dopant profile are typically performed. After any high temperature processes, the further processing may be continued, for instance by forming a metal silicide, followed by the deposition of an interlayer dielectric material, such as silicon nitride, in combination with silicon dioxide and the like. In this manufacturing stage, a top surface of the gate electrode structures embedded in the interlayer dielectric material has to be exposed, for instance, by chemical mechanical polishing (CMP). In many cases, the polysilicon material may be removed in both types of gate electrode structures in a common etch process and thereafter an appropriate masking regime may be applied in order to selectively fill in an appropriate metal, which may be accomplished by filling in the first metal species and selectively removing the metal species from one of the gate electrode structures. Thereafter, a further metal material may be deposited, thereby obtaining the desired work function for each type of transistor.

Although, in general, this approach may provide advantages in view of reducing process-related non-uniformities in the threshold voltages of the transistors, since the high-k dielectric material may be reliably encapsulated during the entire process sequence without requiring an adjustment of the work function and, thus, the threshold voltage at an early manufacturing stage, the complex process sequence for exposing and then removing the placeholder material and providing appropriate work function materials for the different types of transistors may also result in a significant degree of variability of the transistor characteristics, which may result in offsetting at least some of the advantages obtained by the common processing of the gate electrode structures until the basic transistor configuration is completed.

For example, an efficient removal of the polysilicon material may have a significant influence on the overall characteristics of the replacement gate, i.e., on the provision of appropriate work function metals for the N-channel transistor and P-channel transistor and the subsequent deposition of the actual metal-containing electrode material. For this purpose, typically, a dielectric cap layer in the form of a silicon nitride material may be maintained throughout the entire manufacturing process for forming the gate electrode structures and the basic transistor configuration, which may also act as a silicidation mask during the critical process step for forming metal silicide regions in the drain and source areas in order to suppress the formation of a metal silicide in the polysilicon material, since any residues of the silicide material may not be efficiently removed. On the other hand, the cap layer has to be removed by the CMP process, which may result in process non-uniformities, as will be explained with reference to FIGS. 1a-1e.

Figure 1A:
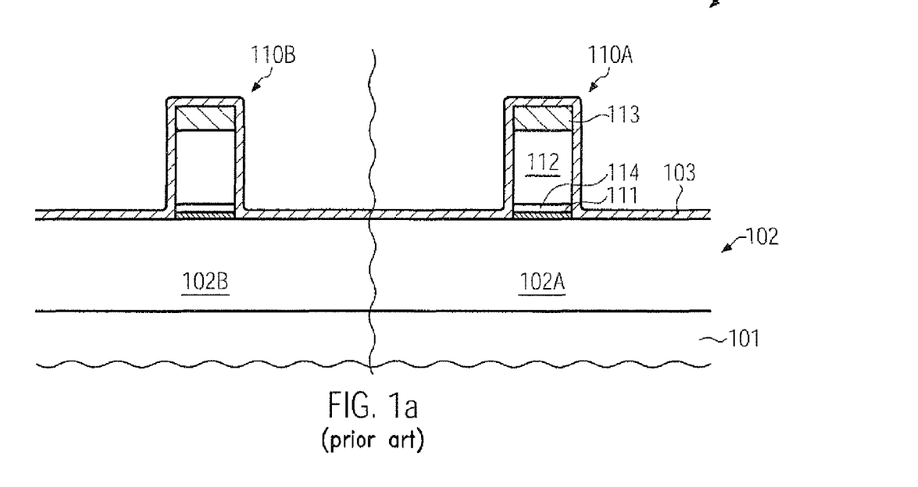
FIGS. 1a-1e schematically illustrate cross-sectional views of a semiconductor device during various manufacturing stages of a manufacturing sequence according to a replacement gate approach based on conventional strategies.

FIG. 1a schematically illustrates a cross-sectional view of a semiconductor device 100 in an early manufacturing stage in which a first semiconductor region 102A and a second semiconductor region 102B are formed in a semiconductor layer 102, which in turn is formed above a substrate 101. The substrate 101 typically represents a silicon-based carrier material above which is formed the semiconductor layer 102, for instance in the form of a silicon-based crystalline material. Moreover, in the manufacturing stage shown, a first gate electrode structure 110A is formed above the first semiconductor region 102A and a second gate electrode structure 110B is formed above the second semiconductor region 102B. Moreover, the regions 102A, 102B and the gate electrode structures 110A, 110B are covered by a spacer layer 103, such as a silicon nitride material. The gate electrode structures 110A, 110B may comprise a sophisticated layer stack, for instance comprising a sophisticated gate dielectric material 111, comprising any high-k dielectric material as specified above, in combination with a titanium nitride cap layer 114. Furthermore, a silicon material 112 is typically formed above the cap layer 114, followed by a dielectric cap layer 113 in the form of a silicon nitride material.

The semiconductor device 100 as illustrated in FIG. 1a may be formed on the basis of the following well-established process techniques. First, the semiconductor regions 102A, 102B may be formed by providing appropriate isolation structures in the semiconductor layer 102, for instance in the form of shallow trench isolations and the like, which, for convenience, are not shown in FIG. 1a. For this purpose, any appropriate process techniques may be applied. Thereafter, the complex gate material stack may be formed by oxidation and deposition techniques using any appropriate process recipes for obtaining the desired materials and the corresponding layer thickness values, such as for the gate dielectric material 111 and the cap layer 114. Thereafter, the silicon material 112 may be deposited on the basis of well-established low pressure chemical vapor deposition (CVD) techniques, followed by the deposition of the silicon nitride cap material 113. Furthermore, if required, any additional materials, such as hard mask materials and anti-reflective coating (ARC) materials, may be formed in accordance with requirements for the subsequent lithography and patterning strategies. Consequently, the gate electrode structures 110A, 110B are obtained with a desired critical length, i.e., in FIG. 1a, the horizontal extension of the material 112, which may be approximately 50 nm and less in sophisticated applications. Thereafter, the spacer layer 103 in the form of a silicon nitride material is deposited by using thermally activated CVD techniques or plasma enhanced deposition recipes so as to obtain a desired layer thickness and material characteristics as required for the further processing. That is, the spacer layer 103 may be used for appropriately covering the sidewalls of the gate electrode structures 110A, 110B and in particular the sidewalls of the sensitive materials 111 and 114 during the further processing. Moreover, the spacer layer 103 may be used for providing sidewall spacers, which may additionally provide a corresponding lateral offset during the incorporation of dopant species for forming drain and source extension regions during the further processing of the device 100. In addition, corresponding sidewall spacer elements may be used as an etch and growth mask for incorporating a strain-inducing semiconductor material, for instance, into the semiconductor region 102A, in order to create a desired strain component therein. It is well established that strain in the channel region of a field effect transistor may have a significant influence on the mobility of the charge carriers and may therefore result in a pronounced modification of drive current capability and thus performance of the transistor. For example, the generation of a compressive strain component in the channel region of P-channel transistors formed on the basis of a standard crystallographic configuration of a silicon layer may result in superior performance, which may be accomplished by incorporating a silicon/germanium alloy into the silicon material, which may result in a corresponding strained state, which may thus create a corresponding strain in the adjacent channel region. The incorporation of the silicon/germanium alloy is typically accomplished by forming cavities in the semiconductor region corresponding to the P-channel transistor, for instance the semiconductor region 102A, and subsequently refilling the cavities by using a selective epitaxial growth technique while substantially suppressing a material deposition on the semiconductor region 102B and the corresponding gate electrode structure 110B when representing an N-channel transistor.

Figure 1B:
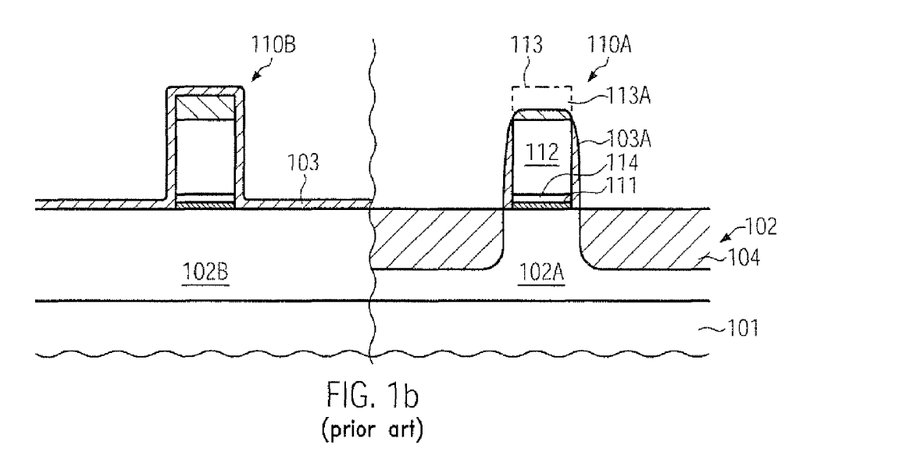

FIG. 1b schematically illustrates the semiconductor device 100 in a further advanced manufacturing stage. As illustrated, a spacer element 103A is formed on sidewalls of the gate electrode structure 110A and may represent a remaining portion of the spacer layer 103, which is substantially completely preserved above the semiconductor region 102B and the gate electrode structure 110B. Moreover, the thickness of the silicon nitride cap layer 113 may be significantly reduced, as indicated by reference number 113A. Additionally, a silicon/germanium alloy 104 is formed in the semiconductor region 102A with a lateral offset from the gate electrode structure 110A, i.e., from the material 112, that may be based on a thickness of the sidewall spacer 103A.

The semiconductor device 100 as illustrated in FIG. 1b may typically be formed on the basis of the following processes. After providing the spacer layer 103, the region 102B and the gate electrode structure 110B are masked, for instance by a resist material, and the exposed portion of the spacer layer 103 is etched so as to form the spacer elements 103A, which may be accomplished on the basis of any well-established anisotropic etch recipe. Thereafter, an appropriate etch chemistry is selected in order to etch into the semiconductor region 102A, thereby forming corresponding cavities, the offset of which may be defined on the basis of the spacer elements 103A and the characteristics of the corresponding etch recipe. It should be appreciated that, during the etch process, a certain amount of the silicon nitride cap layer 113 may also be removed. Thereafter, the remaining resist material is removed and the device 100 is treated on the basis of appropriate cleaning recipes using wet chemical chemistries in order to prepare exposed surface portions for the subsequent selective epitaxial deposition of the silicon/germanium alloy. Thereafter, the silicon/germanium alloy 104 is deposited by applying well-established deposition recipes in order to refill and, if desired, overfill the previously formed cavities. During the selective epitaxial growth process, the silicon nitride cap layer 113A in combination with the spacer element 103A acts as a mask, while the region 102B and the gate electrode structure 110B are still reliably covered by the spacer layer 103. As explained above, the spacer element 103A may also act as an offset spacer during a subsequent implantation process and consequently a corresponding spacer element is also to be formed on sidewalls of the gate electrode structure 110B. Consequently, the semiconductor region 102A and the gate electrode structure 110A are masked by resist material while the spacer layer 103 is exposed to an anisotropic etch ambient in order to form corresponding spacer elements, as is also described above for the spacer element 103A.

Figure 1C:
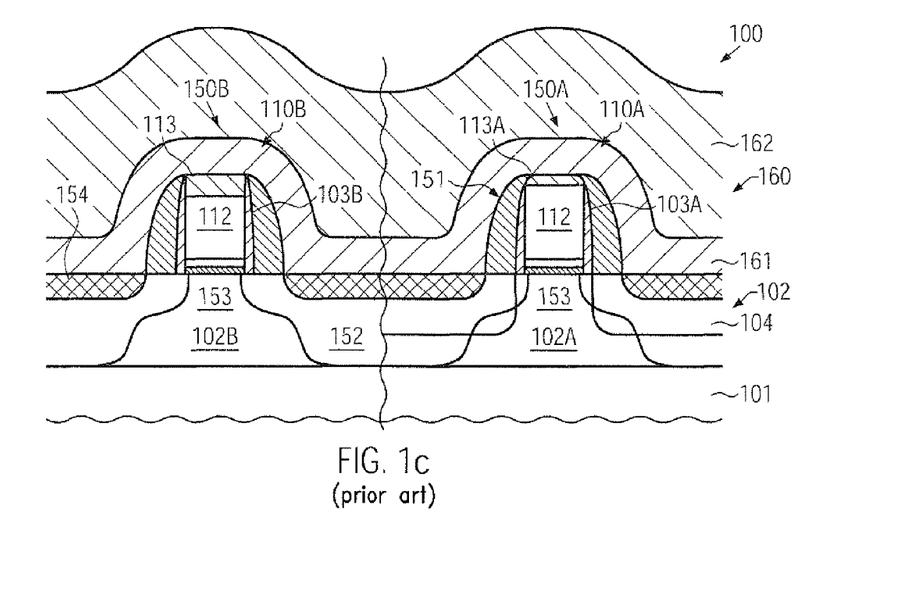

FIG. 1c schematically illustrates a cross-sectional view of the semiconductor device 100 in an advanced manufacturing stage. As illustrated, transistors 150A, 150B are formed in and above the active regions 102A, 102B in combination with the gate electrode structures 110A, 110B. The transistors 150A, 150B comprise drain and source regions 152 in combination with metal silicide regions 154. The drain and source regions 152 laterally enclose a channel region 153, which, in the transistor 150A, may have a certain compressive strain due to the presence of the silicon/germanium material 104. Furthermore, a spacer structure 151 may be formed on sidewalls of the gate electrode structures 110A, 110B, i.e., on the spacers 103A and spacer elements 103B that have been formed in accordance with the above-specified process sequence. It should be appreciated that, typically, the dielectric cap layer 113 of the gate electrode structure 110B may have a greater thickness compared to the dielectric cap layer 113A due to the difference in process history.

The transistors 150A, 150B may be formed on the basis of any appropriate process technique, for instance by incorporating appropriate dopant species in combination with providing the spacer structure 151, thereby obtaining the desired lateral and vertical dopant profile of the drain and source regions 152. After activating the dopant species and preparing exposed surface areas of the device 100 for the subsequent deposition of a refractory metal, such as nickel, platinum and the like, the metal silicide regions 154 are formed by well-established process techniques, wherein the dielectric cap layers 113A, 113 may act as a mask material in order to avoid the formation of a metal silicide in the polysilicon material 112. Next, an interlayer dielectric material 160 is formed, for instance, by depositing a first dielectric layer 161, such as a silicon nitride material and the like, which may act as an etch stop material for patterning a further dielectric material 162, possibly in combination with any additional dielectric materials still to be formed when forming contact openings in the interlayer dielectric material 160. In some cases, the material 161 may be provided in the form of a highly stressed material in order to create a desired type of strain in the channel region 153 of at least one of the transistors 150A, 150B. In sophisticated applications the material 161 is provided with different types of internal stress above the transistors 150A, 150B in order to individually enhance performance of these devices. For this purpose, any appropriate manufacturing strategies are applied in order to deposit the desired material having the internal stress level and removing portions thereof from above one of the transistors 150A, 150B, for which the corresponding internal stress level may result in a deterioration of transistor performance.

Figure 1D:
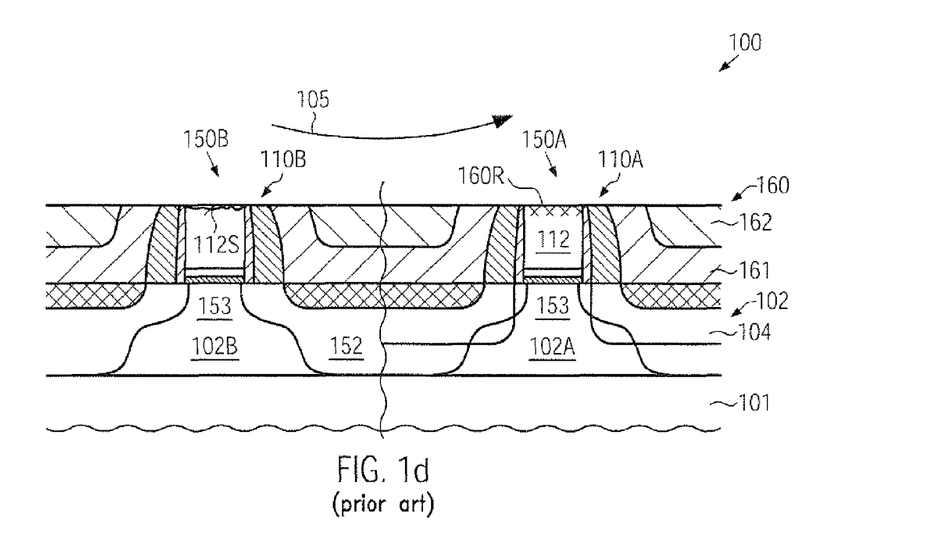

FIG. 1d schematically illustrates the semiconductor device 100 during a polishing process 105, which may be applied so as to planarize the surface of the interlayer dielectric material 160 and to remove a portion thereof so as to finally expose the material 112. Generally, a polishing process, for instance in the form of a chemical mechanical polishing process (CMP), may rely on the physical interaction of abrasive particles supplied by a slurry material and/or being present in a polishing pad, which may contact the material 160 on the basis of well-defined process parameters, such as relative speed between the material 160 and the polishing pad, the downforce and the like. Furthermore, frequently, a chemical reaction may be concurrently initiated at the surface to be polished on the basis of appropriate chemical agents contained in the slurry material. Consequently, although CMP represents a very effective process for removing materials and concurrently providing a substantially planar surface topography, the removal of different materials, such as silicon dioxide, silicon nitride, possibly in differently stressed states, may represent a very complex process step, wherein also a pronounced material removal between the gate electrode structures 110A, 110B is to be avoided as a metal-containing material will be deposited in the subsequent manufacturing stage. It turns out that, during the polishing process 105, in particular the removal of the cap layers 113A, 113 (FIG. 1c) may result in significant process non-uniformities such as material residues of the cap layer which may still be present in a surface 112S of the polysilicon material 112. For example, typically, the cap layer 113 (FIG. 1c) may have an increased thickness, which may require a certain degree of over-polish time, which on the other hand may result in the generation and incorporation of any residues 160R in the material 112 of the gate electrode structure 110A, since the material 112 may be exposed earlier due to the reduced thickness of the dielectric cap layer 113A (FIG. 1c). Furthermore, the additional polish time may result in unwanted removal of material of the gate electrode structure 110A, thereby possibly unduly reducing the height thereof, which may also result in process and device irregularities upon finishing the semiconductor device 100.

Figure 1E:
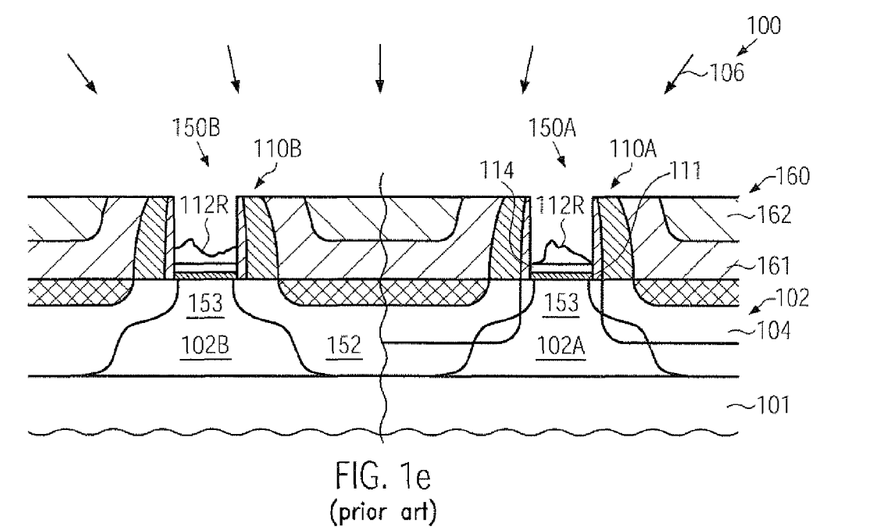

FIG. 1e schematically illustrates the semiconductor device 100 when exposed to an etch process 106 that is performed on the basis of an appropriate etch chemistry in order to remove the material 112 selectively to the interlayer dielectric material 160 and the cap layer 114. For instance, very selective etch chemistries are available so as to efficiently remove polysilicon material substantially without unduly damaging the cap layer 114 and the under-lying high-k dielectric material, while also substantially maintaining the dielectric materials. However, due to the presence of non-removed portions or any other polishing related residues as described above with reference to FIG. 1d, the polysilicon material may not be completely removed so that corresponding residues 112R may still be present after the etch process 106. However, applying any pronounced over-etch times may not be a desirable option in view of integrity of the layers 114 and 111.

Consequently, during the further processing, i.e., during the deposition of metal-containing material layers for adjusting the work function of the gate electrode structures 110A, 110B and providing a metal-containing electrode material, the polysilicon residues 112R significantly contribute to yield losses due to severe failures of the gate electrode structures or due to a pronounced variability in transistor characteristics.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present disclosure relates to sophisticated transistor elements in which the final characteristics of gate electrode structures may be adjusted in a very advanced manufacturing stage by replacing a gate material with metal-containing species for adjusting an appropriate work function and obtaining a highly conductive gate electrode material. For this purpose, the initial gate electrode structure may comprise an efficient dielectric cap layer, for instance for acting as an etch and deposition mask when providing a strain-inducing semiconductor alloy and/or acting as a mask for avoiding a silicidation of the sacrificial gate material, and this dielectric cap material may be efficiently removed prior to performing a corresponding removal process, such as a CMP process, for finally exposing the sacrificial gate material to be replaced by the required metal-containing materials. The removal of the dielectric cap layer may be accomplished on the basis of a mask material, which, in some illustrative embodiments, may be provided in the form of a sacrificial material such as a polymer material, a resist material and the like, so that other device features, such as sidewall spacer structures, metal silicide regions in the drain and source areas and the like, may be efficiently protected. Consequently, after the removal of the dielectric cap layer, or at least after removing a significant portion thereof, the uniformity of a subsequent removal process, such as a polishing process to be performed for exposing the sacrificial gate material, may be significantly enhanced, thereby also enabling a uniform removal of the sacrificial gate material. Hence, the desired metal-containing electrode materials may be filled into the gate electrode structures with superior uniformity, thereby obtaining enhanced overall transistor characteristics.

One illustrative method disclosed herein comprises forming a sacrificial mask material above a gate electrode structure of a transistor, wherein the gate electrode structure comprises a high-k dielectric material, a placeholder material formed above the high-k dielectric material and a dielectric cap layer that is formed above the placeholder material. The method further comprises removing at least a portion of the dielectric cap layer in the presence of the sacrificial mask material and thereafter removing the sacrificial mask material. Additionally, an interlayer dielectric material is formed above the transistor and a material removal process is performed to expose the placeholder material. Additionally, the method comprises replacing the placeholder material with a metal-containing electrode material.

A further illustrative method disclosed herein comprises forming a first dielectric layer above a transistor so as to cover a gate electrode structure of the transistor and drain and source regions thereof, wherein the gate electrode structure comprises a dielectric cap layer formed above a placeholder material. The method further comprises forming a mask material laterally adjacent to the gate electrode structure in order to expose a portion of the first dielectric layer formed above the dielectric cap layer. Additionally, the method comprises removing the exposed portion of the first dielectric layer and at least a part of the dielectric cap layer in the presence of the mask material. Furthermore, a second dielectric layer is formed above the drain and source regions and the gate electrode structure after removing at least a portion of the dielectric cap layer. The method additionally comprises performing a polishing process to expose the placeholder material of the gate electrode structure and replacing the placeholder material with a metal-containing electrode material.

A still further illustrative method disclosed herein comprises forming a mask material above a first gate electrode structure of a semiconductor device, wherein the first gate electrode structure comprises a first dielectric cap layer formed above a first placeholder material and wherein the second gate electrode structure comprises a second dielectric cap layer formed above a second placeholder material. The method additionally comprises removing a portion of the mask material and performing an etch process to remove the first and second dielectric cap layers in the presence of the mask material after removing a portion thereof. Moreover, the mask material is removed and an interlayer dielectric material is formed above the first and second gate electrode structures. Furthermore, a polishing process is performed to expose the first and second placeholder materials and these materials are replaced by a first and a second metal-containing electrode material, respectively.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The present disclosure generally provides techniques for efficiently exposing a place-holder or sacrificial gate material in a late manufacturing stage by removing at least a portion of a dielectric cap layer in a separate removal process, such as a plasma assisted etch process, prior to depositing the interlayer dielectric material and planarizing the same in order to expose the sacrificial gate material. It has been recognized that, in particular, the removal of the dielectric cap layers, which in many cases may have different thicknesses due to the preceding different process history of the gate electrode structures, may represent a source of further process irregularities upon replacing the sacrificial gate material with the desired metal-containing material layers. Therefore, the removal of at least a significant portion and, in some illustrative embodiments, of substantially the complete dielectric cap layer may result in superior process conditions for the subsequent actual planarization of the interlayer dielectric material, thereby enabling an efficient exposure of the sacrificial gate material and a removal thereof. To this end, in some illustrative embodiments, a sacrificial mask material may be provided so as to protect sidewall spacer structures and the like upon removing the dielectric cap material by an appropriate removal process, such as a plasma assisted etch process, so that integrity of the remaining device features may be substantially maintained, even if dielectric cap layers of different thickness have to be removed. That is, a complex adaptation of thickness of the dielectric cap layers in a preceding manufacturing stage may be omitted, which may typically be performed in accordance with conventional strategies to avoid pronounced uniformities, for instance with respect to N-channel transistors and P-channel transistors, during the sequence for replacing the sacrificial gate material. Such adaptations in thickness of the dielectric cap layers for P-channel transistors, having received a strain-inducing silicon/germanium alloy, and N-channel transistors may frequently be associated with a reduced integrity of the cap layer above the P-channel transistor, which may introduce additional non-uniformities, for instance in the form of metal silicide residues in the sacrificial gate material, which may therefore be avoided in accordance with the process sequence of the present disclosure.

In some illustrative embodiments, the separate removal of the dielectric cap layers may also provide superior process conditions in forming an interlayer dielectric material in a void-free manner in device regions including closely spaced transistor elements. In this case, a less pronounced or less demanding surface topography may be provided for the deposition of at least a portion of the interlayer dielectric material, which may thus result in superior gap filling capabilities. In other cases, when a strain-inducing material is to be incorporated into the interlayer dielectric material, superior conditions may be provided in terms of enhanced gap fill capabilities and increased strain-inducing effect due to the possibility of providing an increased amount of strain-inducing dielectric material in close proximity to the transistor channels.

With reference to FIGS. 2a-2l, further illustrative embodiments will now be described in more detail, wherein reference may also be made to FIGS. 1a-1e, if appropriate.

Figure 2A:
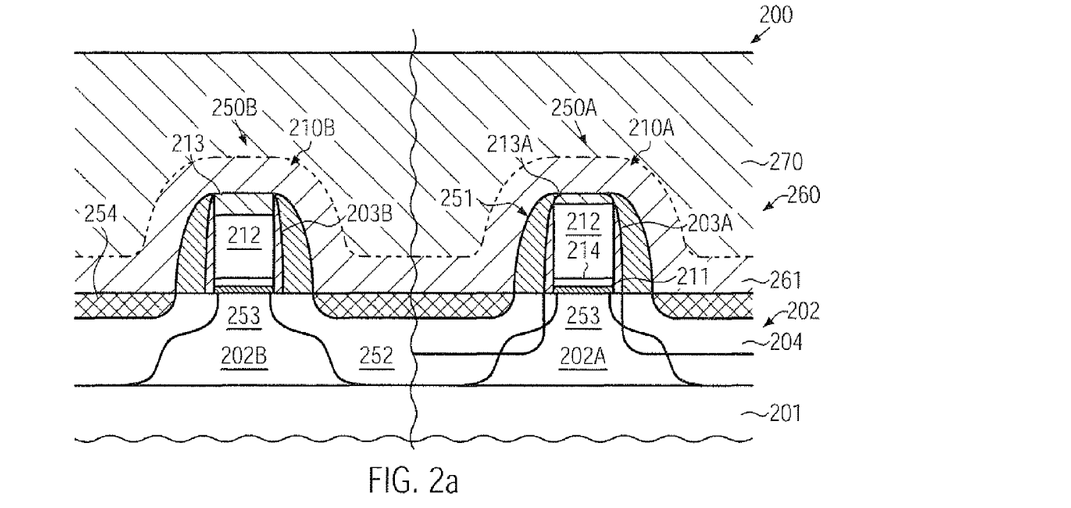
FIGS. 2a-2h schematically illustrate cross-sectional views of a semiconductor device during various manufacturing stages in applying a replacement gate approach by removing at least a portion of a dielectric cap layer in a separate removal process, according to illustrative embodiments.

FIG. 2a schematically illustrates a cross-sectional view of a semiconductor device 200 comprising a substrate 201 and a semiconductor layer 202 formed thereabove. The semiconductor layer 202 may comprise a first active region 202A and a second active region 202B, in and above which may be formed corresponding transistors 250A, 250B. With respect to any characteristics of the substrate 201 and the semiconductor layer 202, the same criteria may apply as previously explained with reference to the device 100. Furthermore, it should be appreciated that a buried insulating layer (not shown) may be provided between the substrate 201 and the semiconductor layer 202 if a silicon-on-insulator (SOI) architecture is considered. In the manufacturing stage shown, the configuration of the transistors 250A, 250B may be substantially completed, i.e., drain and source regions 252 in combination with metal silicide regions 254 and a channel region 253 may be provided in their substantially final state, whereas the characteristics of gate electrode structures 210A, 210B may still have to be adjusted by replacing a portion of the structures 210A, 210B, as previously explained with reference to FIGS. 1a-1e. Furthermore, in some illustrative embodiments, one or both of the transistors 250A, 250B may have incorporated in the corresponding active regions 202A, 202B a strain-inducing semiconductor alloy, such as a silicon/germanium alloy, a silicon/carbon alloy, a silicon/tin alloy and the like. For example, as illustrated in FIG. 2a, the transistor 250A may have incorporated therein a strain-inducing alloy 204, such as a silicon/germanium alloy, as also discussed above with reference to FIGS. 1a-1e.

The gate electrode structure 210A may comprise a gate dielectric material 211, which may typically include a high-k dielectric material, possibly in combination with conventional dielectrics, such as silicon oxide-based materials and the like, while a conductive cap layer 214 may be formed on the layer 211. Furthermore, a placeholder material or sacrificial material 212, for instance in the form of polysilicon, polycrystalline silicon/germanium and the like, may be formed above the layer 214. Furthermore, a dielectric cap layer 213A in combination with sidewall spacers 203A may encapsulate the gate electrode structure 210A. The gate electrode structure 210B may have a similar configuration except for the dielectric cap layer 213, which may have a different thickness compared to the layer 213A due to a different process history, for instance in view of incorporating the material 204 in the active region 202A, as previously explained. Moreover, a sidewall spacer structure 251 may be provided on sidewalls of the gate electrode structures 210A, 210B, i.e., on the spacer elements 203A, 203B. Furthermore, a mask material 270 may be formed above the transistors 250A, 250B, thereby covering the corresponding gate electrode structures 210A, 210B. The mask material 270 may be provided, in some illustrative embodiments, in the form of an organic material, such as a resist material or any other polymer material that may be applied in a low viscous state so as to obtain a substantially planar surface topography upon depositing the material 270 without any additional process steps. In some illustrative embodiments, the mask material 270 may be formed on the drain and source regions 252, i.e., on the metal silicide regions 254, while, in other illustrative embodiments, as illustrated by the layer 261, a dielectric material may be formed in order to efficiently protect sensitive device areas upon removing the mask material 270 in a later manufacturing stage. In some illustrative embodiments, the dielectric layer 261 may be provided in the form of a portion of an interlayer dielectric material, such as a portion of a contact etch stop layer, which may be provided in the form of any appropriate material such as silicon nitride, nitrogen-containing silicon carbide and the like. The dielectric layer 261 may have any appropriate thickness, for instance approximately 10-20 nm, thereby enabling a reliable and conformal deposition of the layer 261 in sophisticated device geometries, for instance including transistor elements having a gate length of 50 nm and less, while a distance between neighboring transistors may be approximately 100 nm and less. In some illustrative embodiments, the layer 261, or at least a portion thereof, may be provided in the form of a highly stressed material in order to enhance performance of one or both of the transistors 250A, 250B. For example, the layer 261 may be provided above the transistor 250A so as to enhance performance thereof and may have a different internal stress above the transistor 250B so as to increase the strain component in the channel region 253 of this transistor.

The semiconductor device 200 as illustrated in FIG. 2a may be formed on the basis of any appropriate process technique for providing the gate electrode structures 210A and 210B, as is, for instance, also described above with respect to the semiconductor device 100. After forming the metal silicide regions 254 based on any well-established manufacturing strategy, with the dielectric cap layers 213A, 213 acting as efficient masks, the layer or layers 261 may be deposited, if provided, followed by the deposition of the mask material 270, which may be accomplished on the basis of spin-on techniques and the like. Due to the low viscous state, pronounced gap fill capabilities may be obtained during the deposition of the material 270, while a certain degree of planarity may also be achieved without any further process steps. In other cases, a mild polishing process may be applied in order to further enhance planarity of the layer 270.

Figure 2B:
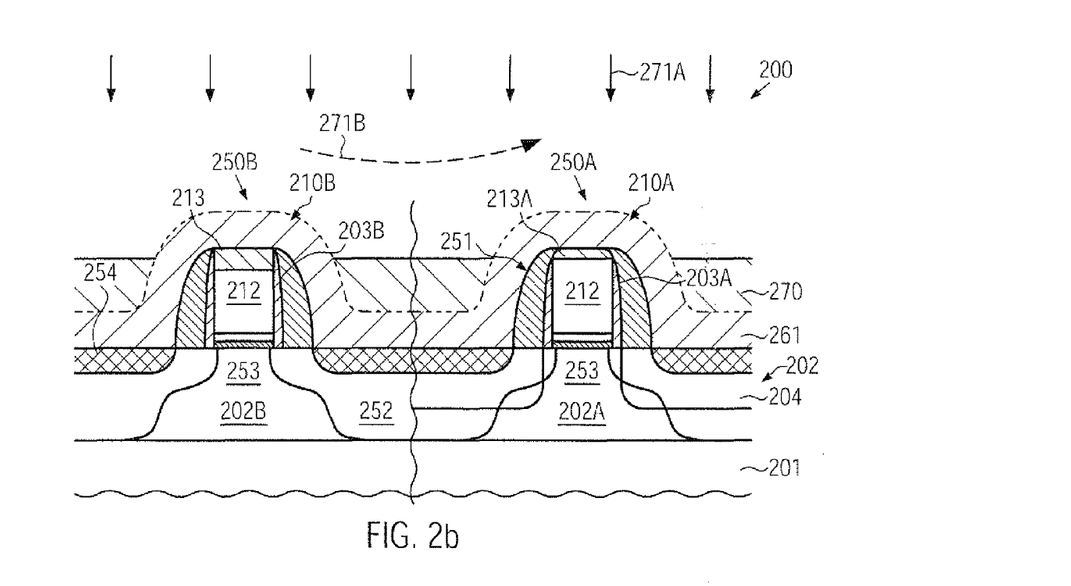

FIG. 2b schematically illustrates the semiconductor device 200 when subjected to a material removal process in order to remove a portion of the mask material 270. For example, the removal process may include an etch process 271A, which may be performed on the basis of a plasma assisted etch ambient including appropriate reactive components, such as oxygen, fluorine and the like. It should be appreciated that a plurality of plasma assisted etch recipes are available for etching polymer materials, such as resist materials and the like. In other cases, in addition to or alternatively to the etch process 271A, the removal process may comprise a polishing process 271B, which may be performed on the basis of appropriately selected polishing parameters, which may be efficiently determined on the basis of experiments and the like. In other cases, a combination of the processes 271B, 271A may be performed, for instance, first the polishing process 271B may be applied in order to further enhance planarity of the mask material 270, followed by the etch process 271A. During the removal process 271A and/or 271B, the cap layers 213A, 213 may be exposed if the dielectric material 261 is not present. In other cases, a portion of the material 261 positioned above the gate electrode structures 210A, 210B may be exposed.

Figure 2C:
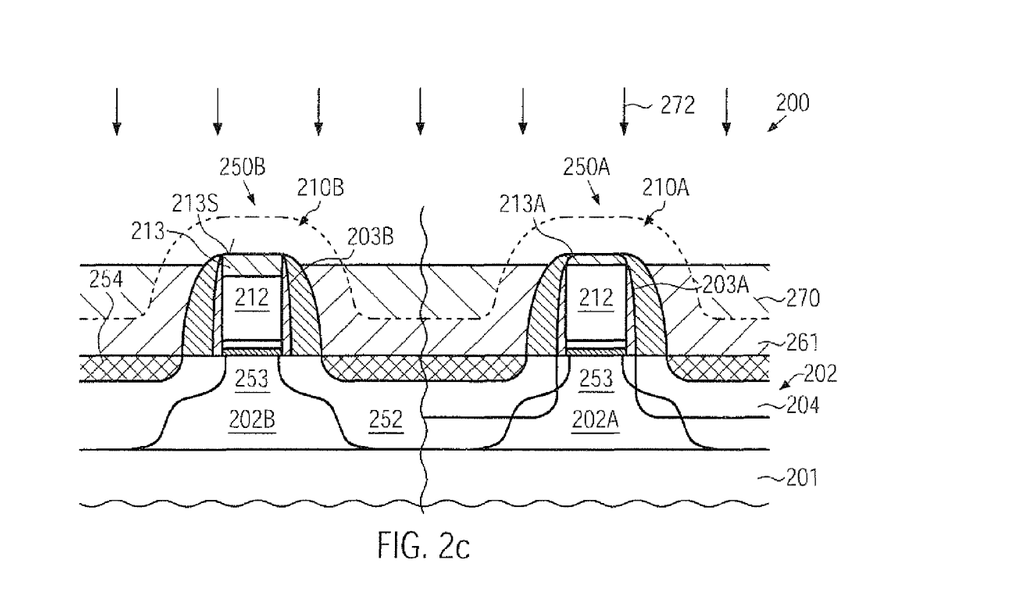

FIG. 2c schematically illustrates the semiconductor device 200 when exposed to a further material removal ambient 272, which, in one illustrative embodiment, may be established in the form of a plasma assisted etch process. For instance, a plurality of etch chemistries are available in order to etch dielectric materials, such as silicon nitride, nitrogen-containing silicon carbide and the like, in the presence of a mask material which may exhibit a significantly lower etch rate. For example, resist materials may be efficiently used as etch masks in a plurality of plasma assisted etch processes for removing any of the above-identified dielectric materials. Consequently, during the process 272, the exposed portion of the layer 261, if provided, may be removed and thus a surface 213S of the cap layers 213A, 213 may finally be exposed to the reactive ambient of the process 272. Consequently, material of the layers 213A, 213 may also be efficiently removed wherein, if required, a different etch chemistry may be applied for the layers 261, if provided, and the dielectric cap layers 213A, 213 may have a significantly different etch behavior.

It should be appreciated that, in other cases, when the layer 261 is not provided, the surface 213S may be immediately exposed to the ambient of the process 272. In some illustrative embodiments, the removal process 272 may be selected such that a pronounced selectivity may be achieved with respect to the material 212. That is, the process 272, for instance the plasma assisted etch process, may efficiently remove material of the layers 261 and 213A, 213, while an etch rate in the material 212 may be significantly less. For example, a plurality of highly selective plasma assisted etch recipes are available in which silicon nitride-based materials may be removed selectively to polysilicon material. Consequently, the etch process 272 may be performed so as to completely remove the layer 213A, which may have a reduced thickness compared to the dielectric cap layer 213, and the process may further advance so as to remove the layer 213 without significantly consuming material of the gate electrode structure 210A. Consequently, the gate height of the structures 210A, 210B may be substantially the same after the removal of the layers 213A, 213, which may thus provide superior process conditions during the further processing. Consequently, the dielectric cap layers 213A, 213 may be reliably removed substantially without affecting the final gate height. Hence, any complex process strategies for adapting the thickness of the layers 213, 213A in an early manufacturing stage, i.e., prior to performing the silicidation process, may be omitted, which may conventionally result in the reduced integrity of the layer 213A, since, during a corresponding adaptation process, the thickness of the layer 213A may also be further reduced.

Figure 2D:
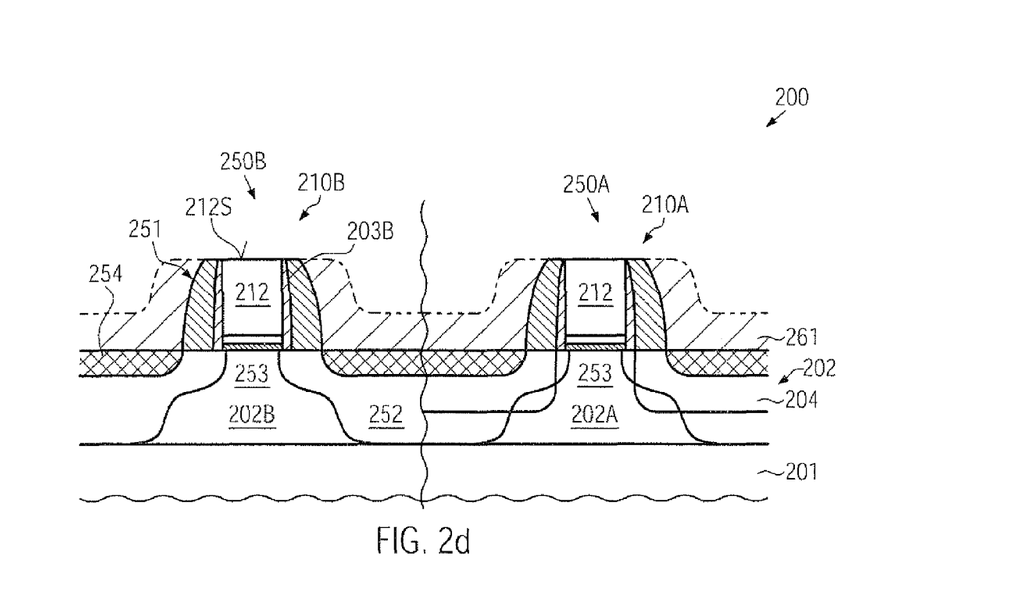

FIG. 2d schematically illustrates the semiconductor device 200 in a further advanced manufacturing stage. As illustrated, the sacrificial gate materials 212 may be exposed in the gate electrode structures 210A, 210B, due to the preceding removal process 272 (FIG. 2c), and the sacrificial mask material 270 (FIG. 2c) may also be removed. This may be accomplished by applying any appropriate etch recipe, such as resist ashing and the like, while, in other cases, wet chemical etch recipes may be applied. It should be appreciated that the preceding removal processes 271A, 271B (FIG. 2b) and 272 (FIG. 2c) may be performed in situ, if desired, and the removal of the mask material 270 may also be accomplished in the same process chamber if a plasma assisted recipe is to be used. In other cases, a separate etch step may be applied. Furthermore, in some illustrative embodiments, a wet chemical cleaning process may be performed in order to remove any organic residues and the like which may have been created during the preceding removal process for exposing the surfaces 212S of the sacrificial gate materials 212. For this purpose, any well-established cleaning recipes may be applied. It should be appreciated that, in embodiments in which the layer 261 is provided in this manufacturing stage, sensitive device areas, such as the metal silicide regions 254, may be efficiently protected during the corresponding sequence for removing the mask material and possibly performing a cleaning process.

Figure 2E:
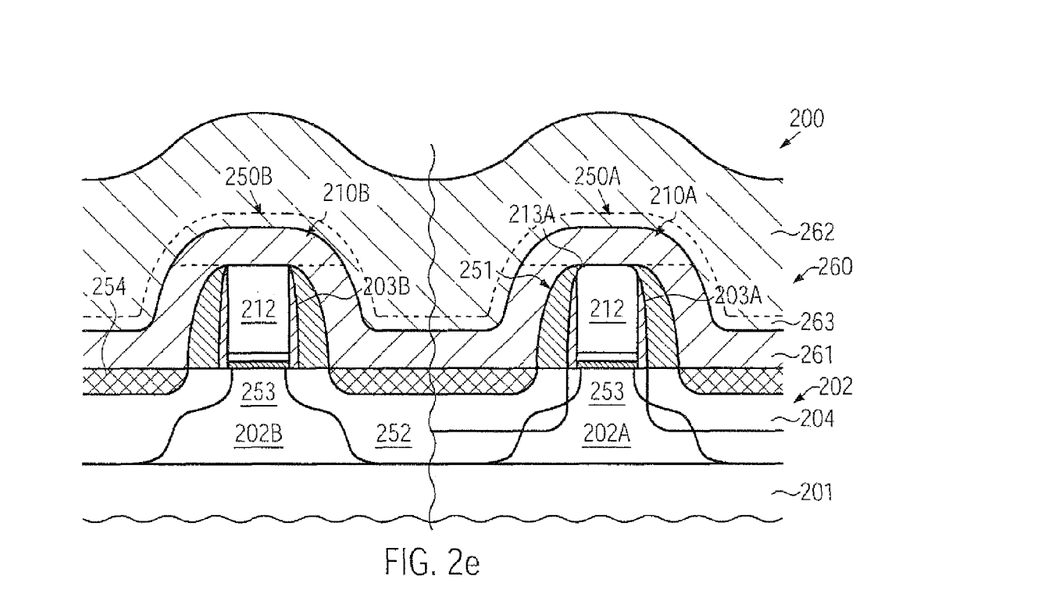

FIG. 2e schematically illustrates the semiconductor device 200 in a further advanced manufacturing stage. As illustrated, an interlayer dielectric material 260 is formed above the transistors 250A, 250B and may comprise the material 261 that may have previously been deposited, as explained above, in combination with a material 262, such as silicon dioxide and the like. Moreover, in other illustrative embodiments, in addition to the layer 261, a further dielectric material 263 may be deposited, which may have similar material characteristics so as to serve as a contact etch stop layer and/or provide a desired stress level in order to enhance performance of one or both of the transistors 250A, 250B. The interlayer dielectric material 260 may be formed on the basis of any well-established deposition techniques.

Figure 2F:
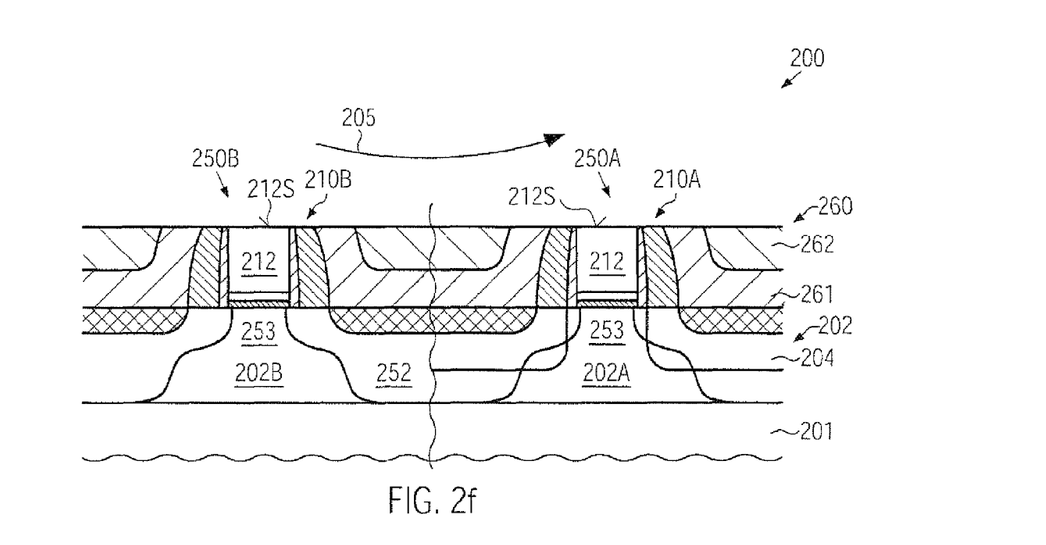

FIG. 2f schematically illustrates the semiconductor device 200 when subjected to a removal process 205 in order to expose the materials 212. As previously explained, the removal process 205 may comprise a polishing process in order to planarize the dielectric material 260 and remove a portion thereof to expose the surfaces 212S without unduly causing material erosion between the gate electrode structures 210A, 210B. Since the dielectric cap layers have been removed separately, the materials 212 may be exposed with superior process uniformity, since pronounced over-polish times may not be required, while nevertheless reliably removing any residues of the materials of the layer 260. It should be appreciated that, even if the layer 263 (FIG. 2e) may be provided, a high degree of process uniformity may be achieved since the layer 263 may be deposited very uniformly above the gate electrode structures 210A, 210B, thereby also resulting in a corresponding uniform removal process.

Figure 2G:
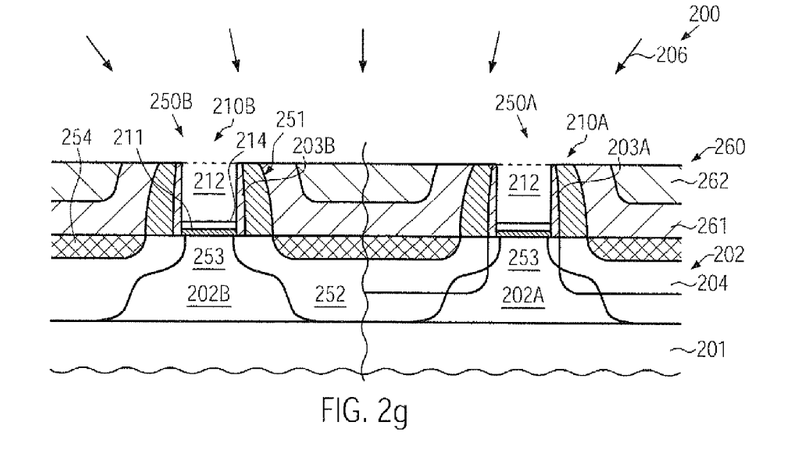

FIG. 2g schematically illustrates the semiconductor device 200 during a selective etch process 206 in order to remove the sacrificial gate material 212 selectively to the conductive cap material 214 and the dielectric material of the layer 260 and the sidewall spacer structure 203A, 203B and 251. For this case, efficient wet chemical etch recipes may be applied, such as TMAH (tetramethyl ammonium hydroxide), potassium hydroxide and the like, wherein superior efficiency may be obtained due to reliable exposure of the material 212. Furthermore, polishing-related residues may be significantly reduced due to the superior uniformity of the removal process, as described above. It should further be appreciated that any polymer residues, which may be caused by the plasma assisted removal process, may be removed on the basis of appropriate cleaning recipes, as previously explained with reference to FIG. 2d. In other cases, the process 206 may include plasma assisted etch recipes, if considered appropriate.

Figure 2H:
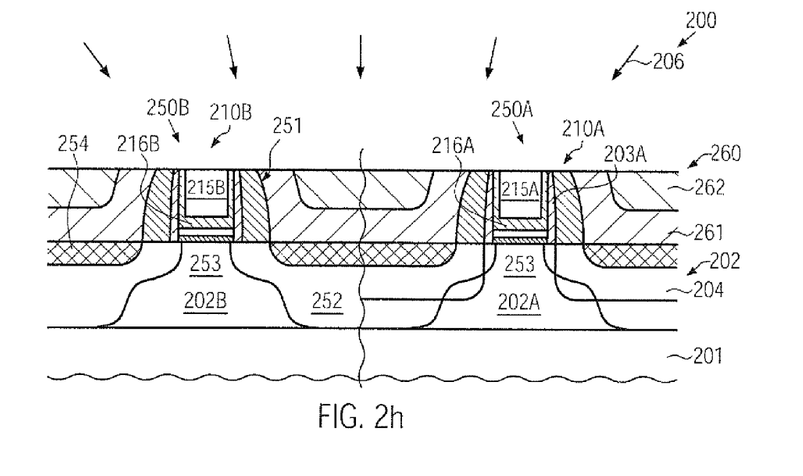

FIG. 2h schematically illustrates the semiconductor device 200 in a further advanced manufacturing stage in which the gate electrode structure 210A may comprise a work function adjusting species 216A in combination with an appropriate metal-containing electrode material 215A, while the gate electrode structure 210B may comprise a corresponding work function adjusting species 216B in combination with a metal-containing electrode material 215B. It should be appreciated that the materials 216A, 216B may be formed on the basis of any appropriate deposition and patterning regime in accordance with appropriate heat treatments, as required. Similarly, the electrode materials 215A, 215B, which may partly be the same material, may be applied by any appropriate process sequence, for instance by CVD, sputter deposition and the like, followed by the subsequent removal of any excess material on the basis of CMP techniques. Due to the efficient removal of the sacrificial gate material 212 (FIG. 2h), the metal-containing materials 215A, 215B may be provided with superior uniformity and reliability, thereby contributing to superior overall transistor characteristics.

Figure 2I:
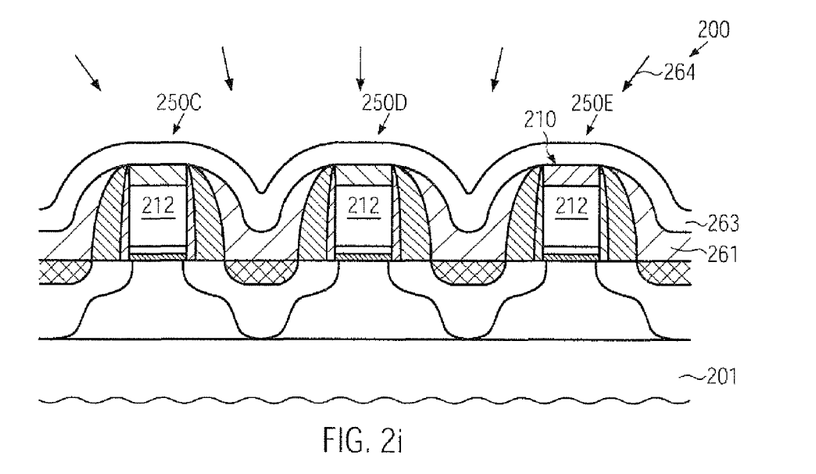
FIGS. 2i-2j schematically illustrate cross-sectional views of the semiconductor device including closely spaced transistor elements in which dielectric cap layers may be removed separately and the gap fill capabilities for forming an interlayer dielectric material may be enhanced, according to further illustrative embodiments.
Figure 2J:
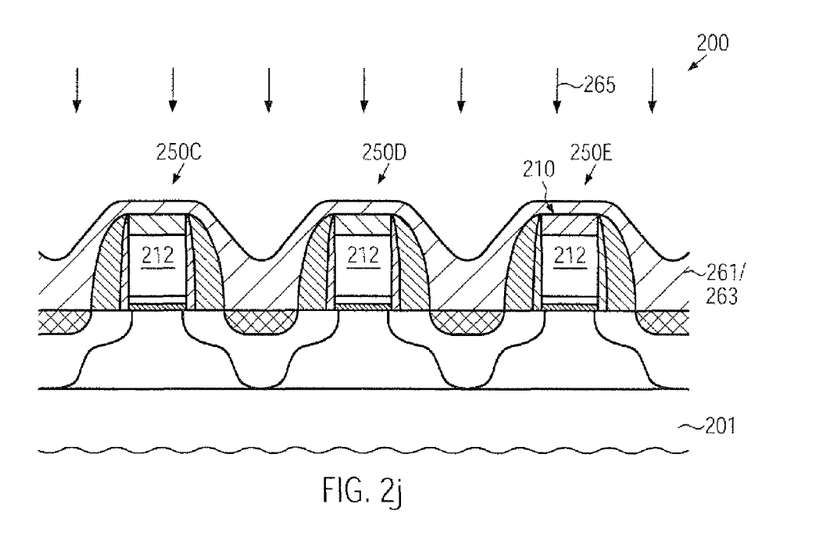

With reference to FIGS. 2i-2j, further illustrative embodiments will now be described in which superior gap fill capabilities may be achieved on the basis of the above-described process sequence.

FIG. 2i schematically illustrates the semiconductor device 200 which may comprise densely spaced transistors 250C, 250D, 250E, each of which may comprise a gate electrode structure 210 which may have a lateral offset from a neighboring one of approximately 150 nm and less. In the manufacturing stage shown, a dielectric cap layer may have been removed on the basis of a process strategy as described above, wherein, prior to the removal sequence, the dielectric layer 261 has been provided, as also explained above. The layer 261 may have been formed on the basis of an appropriate target thickness in order to provide a highly conformal deposition behavior and thus a void-free deposition between the closely spaced transistors 250C, 250D and 250E. After the removal of any dielectric cap layers and possibly after any cleaning processes, the device 200 may be subjected to a further deposition process 264 in order to form the layer 263, which may have any appropriate material composition as may be required for the overall configuration of the device 200. For instance, the layers 261 and 263 may commonly act as a contact etch stop layer and may be comprised of substantially the same material. Additionally, the layers 261 and 263 may be formed so as to have a high internal stress level in order to enhance performance of the transistors 250C, 250D, 250E. Hence, in this case, an increased amount of highly stressed dielectric material may be formed laterally adjacent to the gate electrode structures 210, while only a reduced amount thereof may be formed above the gate electrode structures 210 in the form of the layer 263. It should be appreciated that, due to the less pronounced surface topography obtained by removing the dielectric cap layers and possibly by a certain degree of material erosion of the layer 261, in total, an increased layer thickness may be accomplished between the gate electrode structures 210, thereby providing a superior strain-inducing mechanism, if a very stressed material is provided, while additionally the overall gap filling capability may be enhanced. Consequently, the occurrence of any voids during the deposition of an interlayer dielectric material between closely spaced gate electrode structures 210 may be reduced.

FIG. 2j schematically illustrates the semiconductor device 200 when exposed to an etch ambient 265 in order to further reduce the resulting surface topography by removing a certain amount of material of the layers 261/263. Hence, during the etch process 265, a pronounced "corner rounding" may occur so that the surface conditions for a subsequent deposition step may be less demanding, thereby providing the possibility of providing a further layer of highly stressed material or providing any other portion of the interlayer dielectric material. Consequently, based on the less critical surface topography obtained by removing the dielectric cap layers of the gate electrode structures 210, the subsequent deposition of any further interlayer dielectric material layers may be accomplished under superior process conditions, thereby significantly reducing the probability of creating deposition-related irregularities, such as voids between the closely spaced gate electrode structures 210, and/or providing the possibility of positioning an increased amount of highly stressed dielectric material in close proximity to the channel regions of the transistors 250C, 250D, 250E.

Figure 2K:
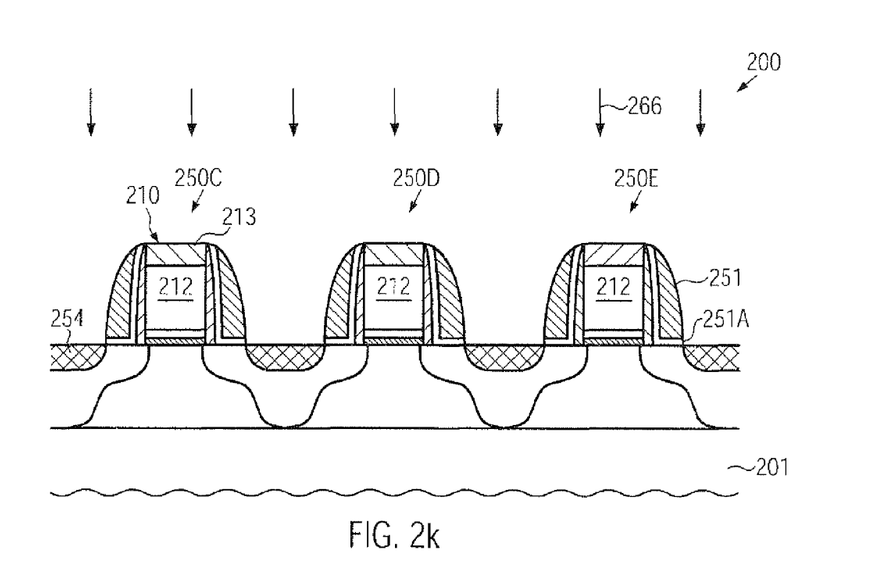
FIGS. 2k-2l schematically illustrate cross-sectional views of the semiconductor device according to still further illustrative embodiments in which the thickness of the dielectric cap layers may be reduced prior to actually removing the dielectric cap layers on the basis of a sacrificial mask material.

FIG. 2k schematically illustrates the semiconductor device 200 according to still further illustrative embodiments in a manufacturing stage after forming the metal silicide regions 254 and prior to removing the cap layers 213. In this stage, an etch process 266 may be performed to remove material of the spacer structures 251 and also of the dielectric cap layers 213, if comprised of a material having a similar etch rate compared to the spacer structure 251. Typically, the spacer structure 251 may comprise an etch stop liner 251A, such as a silicon dioxide material in a spacer structure comprising a silicon nitride spacer element. Consequently, the size of the spacer structure 251 may be reduced substantially without compromising integrity of the gate electrode structures 210. Moreover, the etch process 266 may be performed such that the overall surface topography may be reduced without requiring a complete removal of the dielectric cap layers 213, thereby avoiding undue material erosion of the metal silicide regions 254.

Figure 2L:
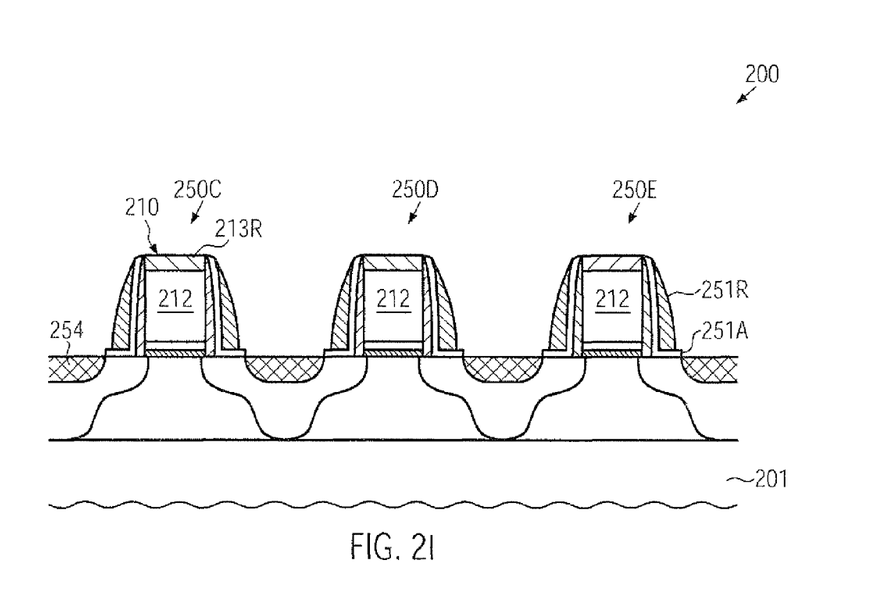

FIG. 2l schematically illustrates the semiconductor device 200 with reduced spacers 251R and reduced dielectric cap layers 213R, wherein, however, any non-uniformities in the resulting thickness may not negatively influence the further processing, since the layers 213R may be efficiently removed in a separate process sequence, as described above. That is, based on the device configuration as shown in FIG. 2l, the further processing may be continued, for instance, by depositing a first dielectric layer in combination with a mask layer and subsequently removing a portion of the dielectric layer and the residual dielectric cap layers 213R, as described above, wherein overall uniformity of the corresponding process sequence may be enhanced due to the reduced thickness. Furthermore, as previously explained, a general non-uniformity of the initial cap layers may also be efficiently "equalized" during the removal process on the basis of selective etch recipes, in which the material 212 may act as an efficient etch stop material, as is also previously explained. Consequently, based on the configuration of FIG. 2l, the deposition of an interlayer dielectric material and the efficient removal of the remaining dielectric cap layers 213R may be accomplished on the basis of a less pronounced surface topography, thereby even further enhancing process conditions during the further processing.

As a result, the present disclosure provides techniques in which a sacrificial gate material may be efficiently replaced with metal-containing materials in that a dielectric cap layer may be removed in a separate process sequence using a mask material so that a subsequently performed polishing process on the basis of an interlayer dielectric material may be performed with superior process uniformity. Consequently, reliability of removing the sacrificial gate material may be increased, thereby also contributing to stable transistor characteristics, for instance in terms of threshold voltage and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a sacrificial mask material above a gate electrode structure of a transistor, said gate electrode structure comprising a high-k dielectric material, a placeholder material formed above said high-k dielectric material and a dielectric cap layer formed above said placeholder material;
   removing at least a portion of said dielectric cap layer in the presence of said sacrificial mask material;
   removing said sacrificial mask material;
   forming an interlayer dielectric material above said transistor;
   performing a material removal process so as to expose said placeholder material; and
   replacing said placeholder material with a metal-containing electrode material.

2. The method of claim 1, wherein performing said material removal process comprises performing a polishing process.

3. The method of claim 1, wherein removing at least a portion of said dielectric cap layer comprises removing said dielectric cap layer so as to expose said placeholder material.

4. The method of claim 1, wherein removing at least a portion of said dielectric cap layer comprises performing a plasma assisted etch process.

5. The method of claim 1, wherein forming said sacrificial mask material comprises applying said sacrificial mask material in a state of low viscosity so as to provide a substantially planar surface topography.

6. The method of claim 1, further comprising removing a portion of said sacrificial mask material so as to expose a top surface of said dielectric cap layer prior to removing at least a portion of said dielectric cap layer.

7. The method of claim 1, further comprising forming a dielectric layer above said transistor prior to forming said sacrificial mask material.

8. The method of claim 7, further comprising removing a portion of said sacrificial mask material so as to expose a portion of said dielectric layer formed above said gate electrode structure.

9. The method of claim 7, wherein said dielectric layer is formed with an internal stress level so as to induce a strain in a channel region of said transistor.

10. The method of claim 1, wherein forming said interlayer dielectric material comprises forming a first dielectric layer above said transistor and forming a second dielectric layer above said first dielectric layer.

11. The method of claim 10, wherein at least said first dielectric layer is formed with in internal stress level so as to induce strain in a channel region of said transistor.

12. The method of claim 1, further comprising removing a portion of a spacer structure formed on sidewalls of said gate electrode structure prior to forming said sacrificial mask material.

13. The method of claim 1, further comprising performing at least one etch process after removing at least said portion of said dielectric cap layer and prior to completing forming said interlayer dielectric material.

14. A method, comprising:
    forming a first dielectric layer above a transistor so as to cover a gate electrode structure of said transistor and drain and source regions, said gate electrode structure comprising a dielectric cap layer formed above a placeholder material;
    forming a mask material laterally adjacent to said gate electrode structure so as to expose a portion of said first dielectric layer formed above said dielectric cap layer;
    removing said exposed portion of said first dielectric layer and at least a part of said dielectric cap layer in the presence of said mask material;
    forming a second dielectric layer above said drain and source regions and said gate electrode structure after removing at least said part of said dielectric cap layer;
    performing a polishing process so as to expose said placeholder material of said gate electrode structure; and
    replacing said placeholder material with a metal-containing electrode material.

15. The method of claim 14, further comprising removing said mask material after removing at least a part of said dielectric cap layer and prior to forming said second dielectric layer.

16. The method of claim 14, wherein forming a mask material comprises depositing said mask material and removing a portion thereof by performing an etch process.

17. The method of claim 14, wherein removing said exposed portion of said first dielectric layer and at least a part of said dielectric cap layer comprises performing a plasma assisted etch process.

18. The method of claim 14, wherein removing said exposed portion of said first dielectric layer and at least a part of said dielectric cap layer comprises removing said dielectric cap layer so as to expose said placeholder material.

19. The method of claim 14, wherein forming said second dielectric layer comprises forming a stressed material that induces a strain in a channel region of said transistor.

20. A method, comprising:
    forming a mask material above a first gate electrode structure and a second gate electrode structure of a semiconductor device, said first gate electrode structure comprising a first dielectric cap layer formed above a first placeholder material, said second gate electrode structure comprising a second dielectric cap layer formed above a second placeholder material;
    removing a portion of said mask material;
    performing an etch process so as to remove said first and second dielectric cap layers in the presence of said mask material after removing a portion thereof;
    removing said mask material;
    forming an interlayer dielectric material above said first and second gate electrode structures;

performing a polishing process so as to expose said first and second placeholder materials; and replacing said first and second placeholder materials by a first and second metal-containing electrode material, respectively.

21. The method of claim 20, wherein said first and second dielectric cap layers have a different thickness.

22. The method of claim 21, wherein performing an etch process for removing said first and second dielectric cap layers comprises performing a plasma assisted etch process and using said at least one of said first and second placeholder materials as an etch stop material.

23. The method of claim 20, further comprising forming a dielectric layer above said first and second gate electrode structures prior to forming said mask material.

24. The method of claim 23, wherein said dielectric layer comprises a strain-inducing layer portion above at least one of said first and second gate electrode structures.

25. The method of claim 20, further comprising forming metal silicide regions in drain and source regions of a first transistor and a second transistor and using said first and second dielectric cap layers as a silicidation mask.

* * * * *